May 16, 1967 J. L. BUIE 3,320,485

DIELECTRIC ISOLATION FOR MONOLITHIC CIRCUIT

Filed March 30, 1964

JAMES L. BUIE,

INVENTOR.

BY HIS ATTORNEYS

Spensley & Horn.

United States Patent Office 3,320,485
Patented May 16, 1967

3,320,485
DIELECTRIC ISOLATION FOR MONOLITHIC CIRCUIT

James Lang Buie, Panorama, Calif., assignor, by mesne assignments, to TRW Inc., a corporation of Ohio
Filed Mar. 30, 1964, Ser. No. 355,605
1 Claim. (Cl. 317—101)

This invention relates to integrated circuits and more particularly to an improved semiconductor structure and method of providing the same.

There are several types of so-called integrated circuits presently being manufactured. The "purest" type is one in which an entire circuit function is provided within a monolithic block of silicon including both active and passive elements as well as interconnections between the various circuit elements.

While the present invention is of particular value for integrated circuits it is equally applicable to other semiconductor devices, both active and passive, such as transistors, diodes, capacitors and resistors.

This invention is primarily concerned with providing isolation of a discreet electrical device in an integrated circuit.

Most prior art methods for achieving isolation between integrated circuit components employ a reversed biased PN junction as a means for achieving isolation. Among these prior art methods are the triple diffusion process, the gate diffusion process, the epitaxial process and the buried layer epitaxial process.

Another prior art process involves the use of an insulating buffer layer between the semiconductor substrate and the header of the package in which the integrated circuit is housed. This isolation technique involves an additional number of manufacturing steps thereby increasing cost and decreasing yield. Further this technique can only achieve isolation between the device and the header, but not between discreet electrical elements of a device from one another.

It is therefore a primary object of the present invention to provide an improved isolated semiconductor integrated circuit.

Another object of the present invention is to provide a technique for isolating the collector of a transistor.

A further object of the present invention is to provide an economical technique for providing isolation between circuit elements in an integrated circuit.

Yet a further object of the present invention is to provide an integrated circuit in which all circuit elements terminate in a plane and wherein such elements are electrically isolated from each other and from the header of the package in which the integrated circuit is housed.

A still further object of the present invention is to provide an isolation technique for integrated circuits which results in high breakdown voltage, very low leakage, low parasitic capacitance and very low saturation voltage.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

Figures 1, 2, 3, 4, 5, 6, 7, 8:
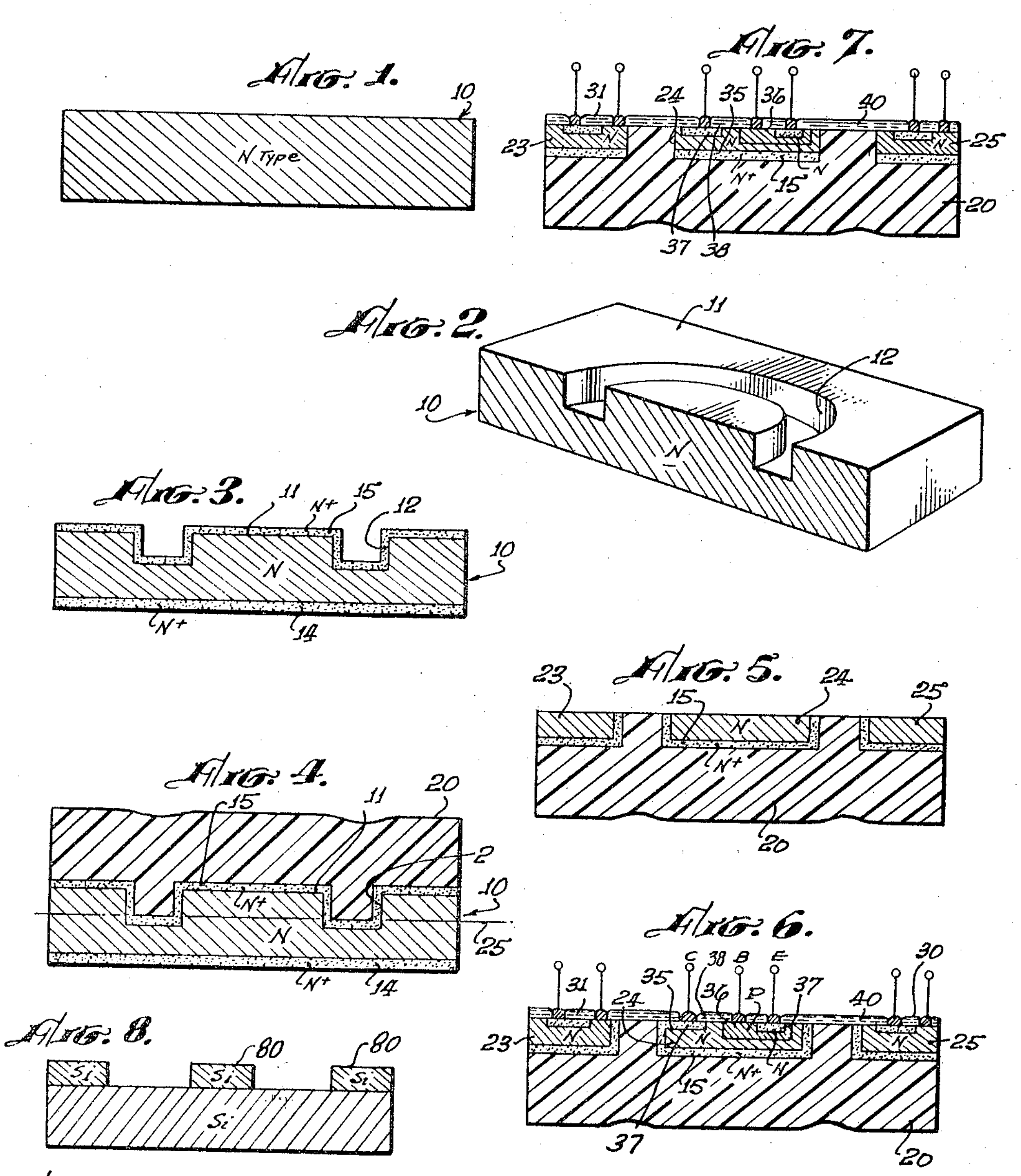
FIGURE 1 is a sectional view of an N type conductivity silicon body which is the starting material for the present invention integrated circuit.
FIGURE 2 is a perspective view of the body of FIGURE 1 at an early stage of production of an integrated circuit constructed in accordance with the presently preferred embodiment of this invention.
FIGURES 3–5 are sectional views of the silicon body of FIGURES 1 and 2 during later stages of manufacture.
FIGURE 6 is a sectional view of a portion of a completed integrated circuit constructed in accordance with this invention.
FIGURE 7 is a sectional view of an alternate construction of an integrated circuit made in accordance with this invention.
FIGURES 8–10 are sectional view of a silicon block during an intermediate stage of production in carrying out other alternate construction of this invention.

Referring now to the drawing and more particularly to FIGURE 1 there is shown a sectional view of an N type conductivity single crystal silicon body. This is the starting material for constructing an integrated circuit in accordance with the presently preferred embodiment of this invention. As was previously mentioned hereinbefore the primary purpose of this invention is to provide a technique for constructing an integrated circuit in which the electrical elements provided within the circuit are electrically isolated one from the other and wherein all the circuit elements terminate in the same plane. A typical resistivity for the starting crystal material of body 10 is from one to ten ohm-cm. This body may be prepared by any conventional prior art method such as by slicing a wafer from Czochralski grown crystal which has an N type impurity, typically arsenic added to the melt prior to the withdrawal of the crystal therefrom.

It is next desired to provide an annular depression or groove within the upper surface 11 of the body 10 wherein the groove is designated by the numeral 12. This groove may be established by a masking and etching process in accordance with well known prior art practices. The purpose of the groove is to define at least one region within the body which is isolated from the remainder thereof. Following the formation of the groove 12 in body 10 there is next formed an N+ diffused layer on the upper and lower surfaces 11 and 14. The layer 15 which is typically 2 microns thick is preferably produced by the diffusion of an N type impurity such as phosphorus from a source of $P_2O_5$ in order to produce a layer approximately 2 microns thick. The thickness of the starting wafer 10 in FIGURES 1 and 2 in this example is 8 mils. The depth of the groove 12 is approximately one mil. The 2 micron diffused layer diffusion step is typically produced by heating the body 10 to a temperature of 1020° C. for three fourths hour in the presence of $P_2O_5$. Of necessity, when the 2 micron layer is formed in the upper surface 11 another N+ layer will be formed in the lower surface 14. Inasmuch as the surface 14 will be removed by a lapping operation during a later stage in the production art integrated circuit the formation of the N+ layer on the bottom surface 14 is of no concern. Alternately the surface 14 may be removed to a depth greater than 2 microns by chemical etching using, for example, 2 parts HF, 15 parts $HNO_3$ and 5 parts acetic acid. Following formation of the N+ layer 15 there is deposited atop the upper surface of layer 15 a relatively thick insulation layer 20 which is molecularly bonded to the N+ layer 15. Layer 20 is preferably formed of silicon in the following manner. The body 10 is placed into an epitaxial reactor of a type well known to the art for the deposition of a silicon semiconductor layer. Instead, however, of producing a semiconductor layer the present invention method employs a vapor phase co-deposition of both silicon and oxygen. In the present method silicon is made available to the substrate by the thermal reduction of trichlorosilane by hydrogen and the oxygen is provided by the reaction of carbon dioxide with hydrogen. By controlling the amount of oxygen present which is available to combine with the silicon, there is deposited a polycrystalline silicon with grain boundaries of silicon dioxide thus rendering the deposited silicon insulating in character rather than semiconducting. The insulating layer formed by this method is preferably of the thickness of approximately 6 mils. This method is described in some detail in an article entitled "Successive Growth of $SiO_2$ in Epitaxial Apparatus" by W. Steinmaier and J. Bloem in the February 1964 issue of Journal of the Electrochemical Society.

An alternate method for forming the dielectric layer 20 is by cathodic sputtering. This is a process whereby a material which makes up the cathode of a high voltage gaseous discharge tube is transported to another portion of the system. Typically an atmosphere of inert gas such as argon at a pressure between 20 to 200 microns and a voltage of 1000–3000 v. is used. The substrate or silicon body 10 is arranged so that the surface 11 is parallel to that of the cathode. During the operation, the inert gas becomes ionized and the gas ions bombard the cathode. The energy of the ions is transferred to the cathodes and as a result particles of the cathode material are dislodged. These particles of atomic dimensions and greater, travel through the gas until they strike the surface 11. By introducing oxygen with the gas in the discharge tube the deposit from the cathode instead of being a semiconductor material, becomes an insulating one.

The dielectric constant of depositions made by the sputtering technique hereinabove described depends upon the oxygen content. Dielectric constants have ranged from 2 to 8. The latter figure was achieved by a deposit which contained 4% $SiO_2$. The maximum rate of deposition observed thus far has been 4 microns per hour.

Following deposition of the insulating layer 20 the silicon body 10 is lapped to the cut line 25 as shown in FIGURE 4. The cut line is just above the lower surface of the groove 12. Thus the body 10 will now appear as shown in FIGURE 6 wherein it is rotated at 180°. Thus 3 insulated regions indicated by the numerals 23, 24 and 25 are separated by the insulating material 20. These 3 separate regions are but representative of any given number which may be desirable for forming a particular integrated circuit. Following the lapping to cut line 25 further diffusion-masking operations are performed in accordance with well known prior art practices including photo-resist, oxide masking and diffusion to produce the NPN transistor as shown in FIGURE 6 in the central island 24. The central island 24 constitutes an NPN transistor whose collector is isolated from the separated diffused elements 30 and 31 which each include P and N regions thus serving as diodes. The NPN transistor includes a plurality of electrodes including a collector region 35, a base region 36 and an emitter region 37. A metallized layer to make ohmic contact to each of these three regions is shown connecting to terminals labeled C, B and E standing for collector, base and emitter the collector electrode 35 has a portion 38 deposited on the plane surface 39 of the insulating material substrate 20, to facilitate easier attachment of the terminal C by presenting a broader plane surface, similar to those attached B and E. Because of the diffusion of the collector region 35 back along the plane 25 from the N+ region 15 with which it is associated, a far better metal-to-semiconductor attachment is made between the lead C and the collector region 35. Note that there is provided an oxide layer $SiO_2$ over the entire upper surface of the integrated circuit which serves to passivate the junctions and the active regions of the devices. Metallized contacts are also provided to the two P and N regions of each of the diodes 30 and 31. Thus the three electrical elements, namely, diodes 30, 31 and transistor 24 all terminate in the same surface of the insulating substrate 20. In addition each of these elements are electrically isolated one from the other by the substrate dielectric material which material also serves to isolate these elements from the header on which the substrate is to be mounted for packaging.

In FIGURE 7 there is shown a structure similar to that of FIGURE 6 which may be produced in a series of steps the same as those described in connection with FIGURES 1–6. The only difference is that instead of making the N+ diffusion after the groove 12 is cut in the surface 11 of the substrate 20 the N+ diffusion of the two micron thick layer 15 is carried out prior to the cutting of the groove 12. Thus the completed structure will in all regards be the same as that of the structure of FIGURE 6 except that the N+ diffused region does not extend upwardly as does the N+ diffused region in the FIGURE 6 structure.

Electrically, the difference between the structure in FIGURE 6 and that of FIGURE 7 is the same except that FIGURE 6 has a lower collector parasitic resistance. This is due to the fact that the N+ layer extends upward vertically and around to the contacting surface, thus permitting a much lower resistance control to the adjacent N region in the FIGURE 6 structure than in the FIGURE 7 structure.

The transistor structure 24 forming part of the integrated circuit shown in FIGURE 6 has been found to result in very much improved electrical characteristics over that which typically result from the manufacture of a planar transistor in an integrated circuit in accordance with prior art practice. For example, the parasitic capacitance of the collector to the substrate in a prior art device is typically something greater than 2 picofarads while the present invention structure results in a parasitic capacitance of something less than 0.1 picofarad. The reverse leakage of the PN junction in the prior art device is typically of the order of $1 \times 10^{-8}$ amps; the present invention structure results in a reverse leakage of the PN junction of the order of $1 \times 10^{-12}$ amps. The breakdown voltage in the present invention junction is typically greater than 200 volts while that of the prior art device is typically of the order of 20 volts. Further the collector parasitic resistance of the present invention device is typically of the order of 5 ohms while that of the prior art device is typically 20 ohms.

While this invention has been described in connection with the manufacture of an integrated circuit from a monolithic block of N type silicon it will be readily apparent to one skilled in the art that P type silicon may be used. Further isolation need not necessarily be brought about by the use of an annular shaped groove; any type of depression which results in the separation of discreet portions of the surface of the starting crystal to at least a predetermined depth will suffice. Other semiconductor materials besides silicon may also be employed and the means for providing the substrate depression upon the surface of the semiconductor starting crystal need not necessarily be limited to insulator growth in an epitaxial reactor and sputtering apparatus although these have been found to be particularly satisfactory.

While this invention has been described with reference to production of an integrated circuit in an N type conductivity block of silicon, it will be readily apparent to one skilled in the semiconductor art that the starting material may be P type silicon or any other semiconductor material upon which an insulating layer may be deposited. It is believed for example, that germanium may be used, although in this instance $GeO_2$ could not be substituted for $SiO_2$ as $GeO_2$ is not stable, instead silicon with oxygen may again be co-deposited upon a germanium substrate.

Also instead of cutting a groove in the starting wafer, plateau 80 may be deposited thereupon as shown in FIGURE 8 to thus define isolated regions. Following the deposit of the silicon plateau 80 to define a structure similar to that shown in FIGURE 2, the steps following to produce the completed device may either be, as described in connection with FIGURES 1–6 and FIGURE 7.

Figure 9:
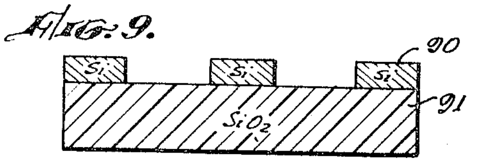

In FIGURE 9 a similar procedure may be adopted except therein the substrate 91 on which the silicon plateaus 90 are deposited is an insulator. Thus following this step, either sputtered or expitaxial silicon with oxygen may be deposited, after which either surface may be removed to expose silicon regions in a place which regions are separated by an insulator to a predetermined depth.

Figure 10:
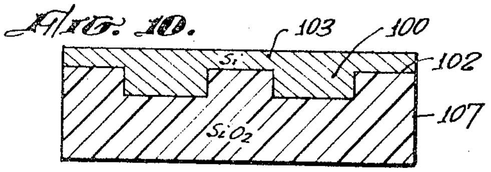

In FIGURE 10 there is shown an insulator substrate 107 which includes grooves in the upper surface 102. Following this single or poly crystal silicon is deposited over the surface 102 thus filling the grooves and providing a layer of silicon 103 thereabove. This layer 103 may then be removed prior to final processing as described hereinbefore. There has thus been described a technique and structure for producing an isolated semiconductor element integrated circuit which avoids the use of PN junctions as an isolation means which is highly reproducible and therefore inherently capable of producing high yields. This structure further results in improved device characteristics such as improved high breakdown voltage, low isolation leakage, low parasitic capacitance and low saturation voltage.

What is claimed is:

A monolithic semiconductor integrated circuit device including the following characteristics:

a monolithic substrate having at least one plane surface;

said substrate being composed of a non-conductive material;

at least two semiconductor elements disposed within said plane surface of said substrate; and portions of said monolithic substrate extending between said semiconductor elements;

said portions being monolithicly continuous with said substrate;

said portions extending between said semiconductor elements in such manner as to insulate each said semiconductor element from all other said semiconductor elements.

References Cited by the Examiner

UNITED STATES PATENTS

| | | | |
|---|---|---|---|
| 3,078,549 | 2/1963 | Wende | 29—155.5 |
| 3,158,788 | 11/1964 | Last | 317—101 |
| 3,176,192 | 3/1965 | Sueur et al. | 317—101 |
| 3,178,804 | 4/1965 | Ullery, et al. | 29—155.5 |
| 3,197,710 | 7/1965 | Lin | 317—101 X |
| 3,235,428 | 2/1966 | Naymik | 317—235 |
| 3,239,908 | 3/1966 | Nakamura | 317—101 X |

OTHER REFERENCES

Electrical Manufacturing, August 1958, pages 94 to 97.

ROBERT K. SCHAEFER, *Primary Examiner.*

R. S. MACON, W. C. GARVERT, J. R. SCOTT, *Assistant Examiners.*